United States Patent
Yazdi et al.

(10) Patent No.: US 7,924,095 B2
(45) Date of Patent: Apr. 12, 2011

(54) OPERATIONAL AMPLIFIERS HAVING LOW-POWER UNCONDITIONALLY-STABLE COMMON-MODE FEEDBACK

(75) Inventors: Ahmad Yazdi, Irvine, CA (US); Ahmad Mirzaei, Costa Mesa, CA (US); Hooman Darabi, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 12/458,630

(22) Filed: Jul. 17, 2009

(65) Prior Publication Data
US 2010/0327974 A1   Dec. 30, 2010

Related U.S. Application Data

(60) Provisional application No. 61/220,765, filed on Jun. 26, 2009.

(51) Int. Cl.
*H03F 3/45* (2006.01)
(52) U.S. Cl. .................. 330/258; 330/260; 330/302
(58) Field of Classification Search .............. 330/258, 330/260, 302
See application file for complete search history.

(56) References Cited

U.S. PATENT DOCUMENTS

| | | | | |
|---|---|---|---|---|
| 5,936,469 A * | 8/1999 | Alexander et al. | ............ | 330/258 |
| 6,531,907 B2 * | 3/2003 | Dooley et al. | ................. | 327/307 |
| 7,012,450 B1 * | 3/2006 | Oner et al. | ....................... | 326/86 |
| 7,397,270 B1 * | 7/2008 | Luo et al. | ........................ | 326/32 |
| 7,679,444 B2 * | 3/2010 | Forejt | ............................ | 330/258 |
| 7,714,652 B2 * | 5/2010 | Mangudi et al. | .............. | 330/253 |

* cited by examiner

*Primary Examiner* — Patricia Nguyen
(74) *Attorney, Agent, or Firm* — Sterne, Kessler, Goldstein & Fox P.L.L.C.

(57) ABSTRACT

An operational amplifier is provided. The operational amplifier includes a first transistor configured to receive a first input voltage, a second transistor configured to receive a second input voltage, and a current steering module coupled to first and second transistors and configured to receive a reference voltage. The first and second transistors form a differential pair. The first transistor, second transistor, and current steering module are configured such that a current is steered from the current steering module or to the current steering module based on common-mode voltages of the first and second input voltages and the reference voltage to set a common-mode output voltage of the operational amplifier.

15 Claims, 8 Drawing Sheets

FIG. 1
Conventional

OPERATIONAL AMPLIFIERS HAVING LOW-POWER UNCONDITIONALLY-STABLE COMMON-MODE FEEDBACK

CROSS REFERENCE TO RELATED APPLICATIONS

This application claims the benefit of U.S. Provisional Appl. No. 61/220,765, filed Jun. 26, 2009, which is incorporated by reference herein in its entirety.

BACKGROUND OF THE INVENTION

1. Field of the Invention

The invention generally relates to the field of amplifiers, and more particularly to the common-mode feedback in differential or operational amplifiers.

2. Background Art

Operational amplifiers (op-amps) are circuits that produce a variety of different types of signals based on a set of inputs and the particular configuration in which they are used. The outputs of an op-amp sometimes are offset by a common-mode voltage. The common-mode voltage is usually a DC voltage that offsets the information-bearing AC signal. This common-mode voltage can be set by introducing a DC feedback path between the inputs and outputs of the op-amp. For example, a relatively simple op-amp can be introduced that compares the output common-mode voltage to a reference voltage, and based on that comparison sets a feedback signal that ultimately shifts the output common-mode voltage in a desired direction.

Including another feedback loop to set the output common-mode voltage of an op-amp, however, can have a number of disadvantages. For example, the loop used to set the differential-mode output voltage and the loop used to set the common-mode output voltage may have different stable ranges. Thus, conditions may exist under which the differential-mode output voltage is stable but the common-mode output voltage is not, and vice versa. Therefore additional compensation capacitors and resistors are required to make both loops stable. The additional circuitry used to create the common-mode feedback loop can consume additional power, take up additional space, and increase the response time to changes in the input common-mode voltage.

Thus, what is needed is an op-amp that allows the output common-mode voltage to be set without requiring additional circuitry that makes the op-amp conditionally stable and substantially contributes to the size, power consumption, and response time of the op-amp.

BRIEF SUMMARY

An operational amplifier is provided. The operational amplifier includes a first transistor configured to receive a first input voltage, a second transistor configured to receive a second input voltage, and a current steering module coupled to first and second transistors and configured to receive a reference voltage. The first and second transistors form a differential pair. The first transistor, second transistor, and current steering module are configured such that a current is steered from the current steering module or to the current steering module based on common-mode voltages of the first and second input voltages and the reference voltage to set a common-mode output voltage of the operational amplifier.

In another embodiment, an amplifier circuit includes first and second resistors configured to receive first and second input voltages respectively and an operational amplifier. The operational amplifier includes a first transistor coupled to the first resistor, a second transistor coupled to the second resistor, and a current steering module coupled to first and second transistors and configured to receive a reference voltage. The first and second transistors form a differential pair. The first transistor, second transistor, and current steering module are configured such that a current is steered from the current steering module or to the current steering module based on common-mode voltages of the first and second input voltages and the reference voltage to set a common-mode output voltage of the operational amplifier.

In another embodiment, a method of amplifying first and second input signals includes receiving a first voltage signal at a first transistor of an operational amplifier, receiving a second voltage signal at a second transistor of an operational amplifier, steering current from a current steering module or to the current steering module based on a voltage reference voltage and common-modes of the first and second voltage signals to set an output common-mode voltage of the operational amplifier. The first and second transistors form a differential pair. The first and second transistors are coupled to a current steering module.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1:
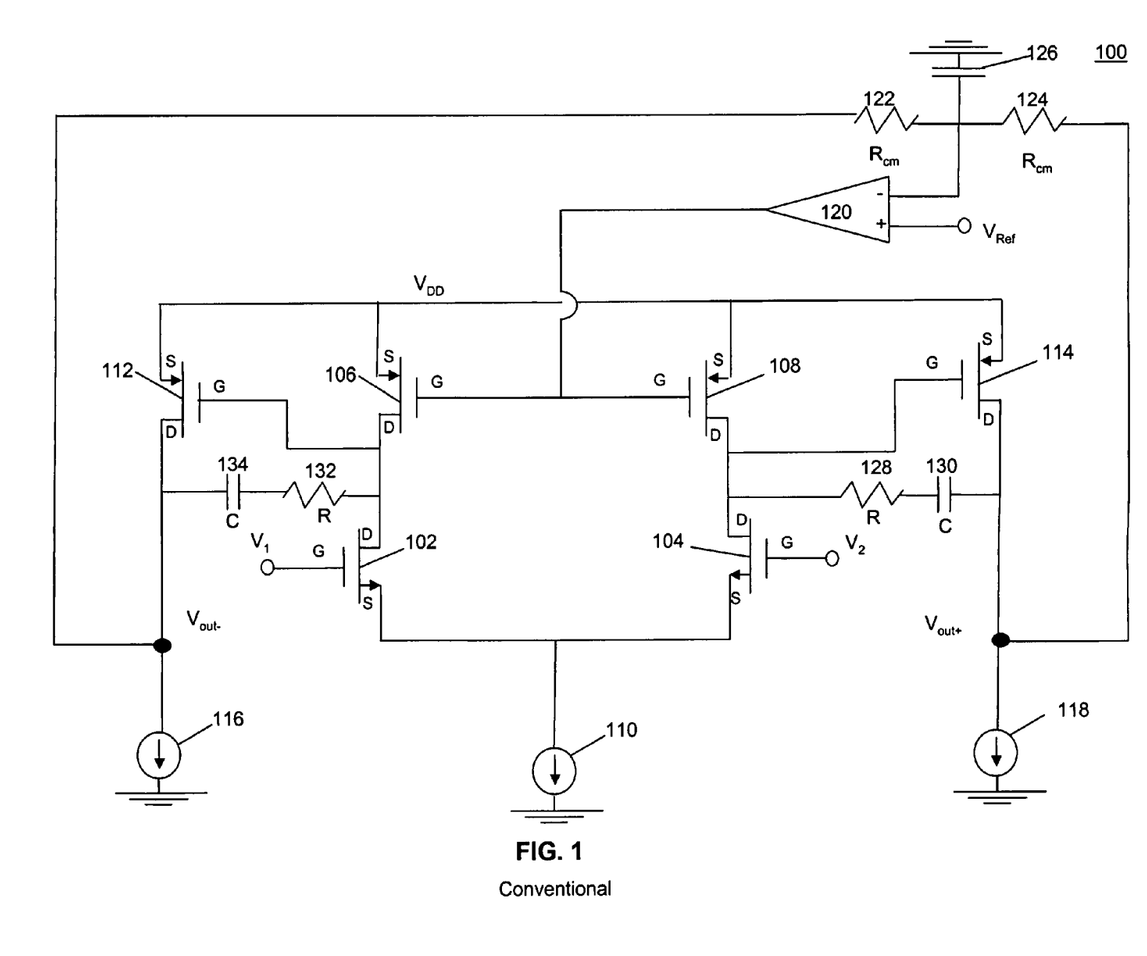
FIG. 1 shows a circuit diagram of an operational amplifier with conventional common-mode feedback.

FIG. 1 shows a circuit diagram of a conventional operational amplifier (op-amp) 100. Op-amp 100 includes NMOS transistors 102 and 104, PMOS transistors 106, 108, 112, and 114, current sources 110, 116, and 118, resistors 122, 124, 128, and 132 capacitors 126, 130, and 134 and a single-stage op-amp 120. A first stage of op-amp 100 includes transistors 102-108, and current source 110 provides the current that passes through the first stage. Transistors 102 and 104 form a differential pair that receives first and second input voltages $V_1$ and $V_2$, respectively, and transistors 106 and 108 form a load for the first stage of op-amp 100.

A second stage of op-amp 100 includes transistors 112 and 114. Current sources 116 and 118 provide the current that passes through transistors 112 and 114, respectively. Transistors 112 and 114 provide the gain for the second stage of op-amp 100. A differential mode feedback loop including the first and second stages of op-amp 100 generates an amplified differential output at nodes $V_{out-}$ and $V_{out+}$. In an embodiment, the differential mode feedback loop can also include other components (e.g., resistors, capacitors, etc.) external to op-amp 100 that couple the inputs and outputs of op-amp 100 (not shown in FIG. 1). Resistors 128 and 132 and capacitors 130 and 134 are used to provide stability for the differential mode feedback loop.

A common-mode feedback loop is used in op-amp 100 to set its common-mode output voltage. This feedback loop includes a one-stage op-amp 120 that compares the output common-mode voltage of op-amp 100 to a reference voltage $V_{Ref}$. Op-amp 120 senses the output common-mode voltage of op-amp 100 through resistors 122 and 124. Resistors 122 and 124 typically have large resistances, e.g., on the order of 15 MΩ. The output of op-amp 120 is coupled to the gates of transistors 106 and 108. This output, then, controls the current flowing through transistors 106 and 108, and thus the current through the first stage of op-amp 100. Capacitor 126 is used to stabilize the common-mode feedback loop. Thus, op-amp 120 provides a DC feedback path between the input and output of op-amp 100 so that the output common-mode voltage of op-amp 100 can be set.

The additional feedback loop used to set the common-mode output voltage can cause stability problems. For example, such a feedback loop can make op-amp only conditionally stable. Specifically, the common-mode feedback loop may have different stability conditions than the differential mode feedback loop. Thus, instances may arise when only the differential-mode output is stable, or vice versa.

The additional feedback loop also takes up space in op-amp 100 and increases the total power consumption of op-amp 100. Furthermore, to stabilize the common-mode feedback loop of op-amp 100, capacitor 126 must be a large capacitor. Such a large capacitor also takes up space in op-amp 100 and can slow down the common-mode response time of op-amp 100. In particular, capacitor 126 can slow op-amp 100 so that it cannot respond quickly to changes in the input common-mode voltage to op-amp 100.

Exemplary Embodiments

In embodiments described herein, op-amps are provided that allow the output common-mode voltage to be set without an additional feedback loop, as required in op-amp 100. The output common-mode voltage in op-amps according to embodiments described herein is set using the same loop that is used to provide a differential-mode output. Using the same loop for common and differential-mode outputs makes op-amps according to embodiments described herein unconditionally stable. In other words, whenever the differential-mode output is stable, so is the common-mode output and vice versa. Moreover, removing devices used in conventional common-mode feedback loops can also reduce power consumption, save space, and decrease the response time to changes in the input common-mode voltage.

Figure 2:
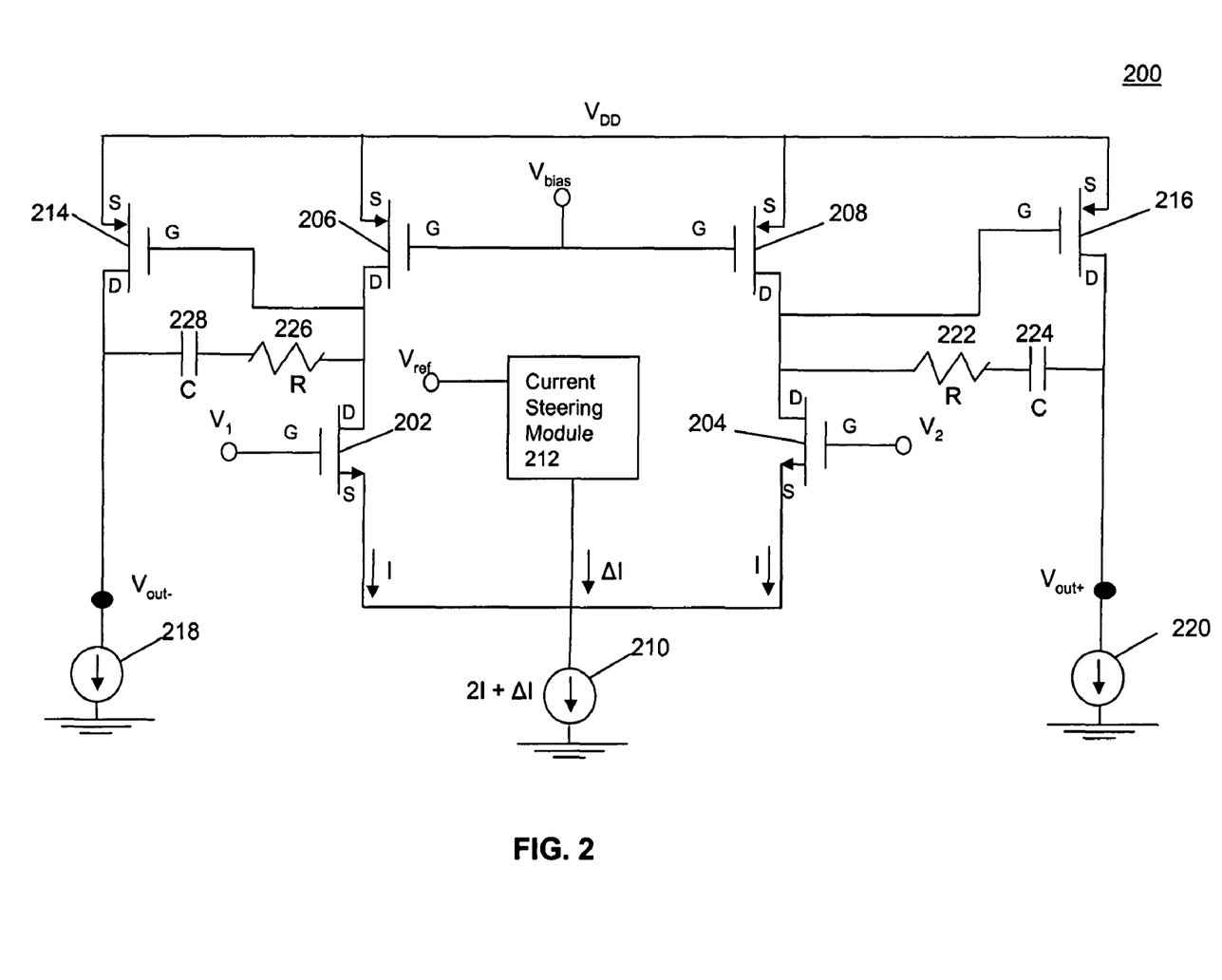
FIGS. 2-5 show circuit diagrams of operational amplifiers, according to embodiments of the present invention.

FIG. 2 shows a circuit diagram of an op-amp 200, according to an embodiment of the present invention. Op-amp 200 includes NMOS transistors 202 and 204, PMOS transistors 206, 208, 214, and 216, resistors 222 and 226, capacitors 224 and 228, current sources 210, 218, and 220, and a current steering module 212. Transistors 202-208 form a first stage of op-amp 200. Transistors 202 and 204 form a differential pair and receive input voltages $V_1$ and $V_2$, respectively. Transistors 206 and 208 form a load for the first stage of op-amp 200. As shown in FIG. 2, a bias voltage $V_{bias}$ is applied to the gates of transistors 206 and 208. In an embodiment, the bias voltage $V_{bias}$ is set so that transistors 206 and 208 operate in saturation. The bias voltage $V_{bias}$ can be generated by methods known to those skilled in the relevant art(s).

Transistors 214 and 216, similar to transistors 112 and 114, respectively, described with reference to FIG. 1, form a second stage of op-amp 200. Current sources 218 and 220 provide the current that flows through transistors 214 and 216, respectively. Similar to resistors 128 and 132 and capacitors 130 and 134, described with reference to FIG. 1, resistors 222 and 226 and capacitors 224 and 228, respectively, are used to provide stability for the first and second stages of op-amp 200.

The current that current source 210 provides is equal to the sum of the currents that passes through each of transistors 202 and 204 and the current that passes through current steering module 212. Because the common-mode voltages of inputs $V_1$ and $V_2$ are typically the equal, the current that travels through transistor 202 is typically substantially equal to the current that passes through transistor 204. Thus, the total current provided by current source 210 can be expressed as 2I+ΔI, where I is the current that passes through each of transistors 202 and 204 and ΔI is the current that passes through current steering module 212. Although embodiments are described with reference to the embodiment in which the common-mode voltages of inputs $V_1$ and $V_2$ are substantially equal, those skilled in the relevant art(s) will recognize that the op-amps provided herein can also be used in cases where the common-mode voltages of inputs $V_1$ and $V_2$ are not substantially equal.

As the input common-mode voltage received by transistors 202 and 204 increases, current I also increases, i.e., current is steered away from current steering module 212. As current I increases, the drain voltages of transistors 206 and 208 decrease. Because the gates of transistors 214 and 216 are coupled to the drains of transistors 206 and 208, respectively, the gate voltages of transistors 214 and 216 also fall as current I increases. As the gate voltages of transistors 214 and 216 fall, the current passing through them increases, increasing the output common-mode voltage of op-amp 200. As would be appreciated by those skilled in the relevant art(s) based on the description herein, as the input common-mode voltage received by transistors 202 and 204 decreases, current is steered to current steering module 212 and the output common-mode voltage of op-amp 200 decreases in a manner similar to as described above.

Current steering module 212 receives a reference voltage $V_{Ref}$. In an embodiment, reference voltage $V_{Ref}$ along with the input common-mode voltage determine the ratio between currents ΔI and I. In a further embodiment, as $V_{Ref}$ rises, so does current ΔI.

Thus, as the input common-mode voltage changes, current I is correspondingly changes by steering current from or to current steering module 212 so that the output common-mode voltage rises and falls consistent with the input common-mode voltage. The value of output common-mode voltage can depend on the input common-mode voltage. If the input common-mode voltage is known beforehand, the output common-mode voltage can be set to a desired level by providing a DC feedback path (not shown in FIG. 2, see, e.g., FIG. 4) between the inputs and outputs of op-amp 200. Doing so makes the output common-mode voltage dependent on the input common-mode voltage and reference voltage $V_{ref}$, as well as the elements used to create the DC feedback path, e.g., the values of the resistors used to create the DC feedback path. The input common-mode voltage is typically a function of circuits preceding op-amp 200 in a chain of devices, e.g., in a signal receiver. The input common-mode voltage is, then, typically well-defined and known before the specific values for reference voltage $V_{ref}$ and the elements of the DC feedback path are set. Knowing the input common-mode voltage, the desired output common-mode voltage can be set by suitably choosing reference voltage $V_{ref}$ and the specifics of the DC feedback loop.

In contrast to op-amp 100, shown in FIG. 1, op-amp 200 does not require an additional feedback loop to set its output common-mode voltage. Instead, the elements of the differential-mode loop, i.e., the first and second stages of op-amp 200, are used to set the output common-mode voltage. In doing so, the common-mode feedback loop of op-amp 200 becomes unconditionally stable, i.e., whenever the differential-mode output of op-amp 200 is stable so is the common-mode output. In other words, no condition exists under which the differential-mode output would be stable and the common-mode output would not and vice versa. Current steering module 212 can also be implemented smaller and be configured to consume less power than single-stage op-amp 120 and capacitor 126 of op-amp 100. Furthermore, the elimination of large capacitor 126 may also help op-amp 200 respond more quickly to changes in the input common-mode voltage.

Thus, replacing the common-mode feedback loop of op-amp 100 with current steering module 212 can lead to an op-amp that is unconditionally stable, occupies less space, consumes less power, and responds quicker to changes in the input common-mode voltage.

Figure 3:
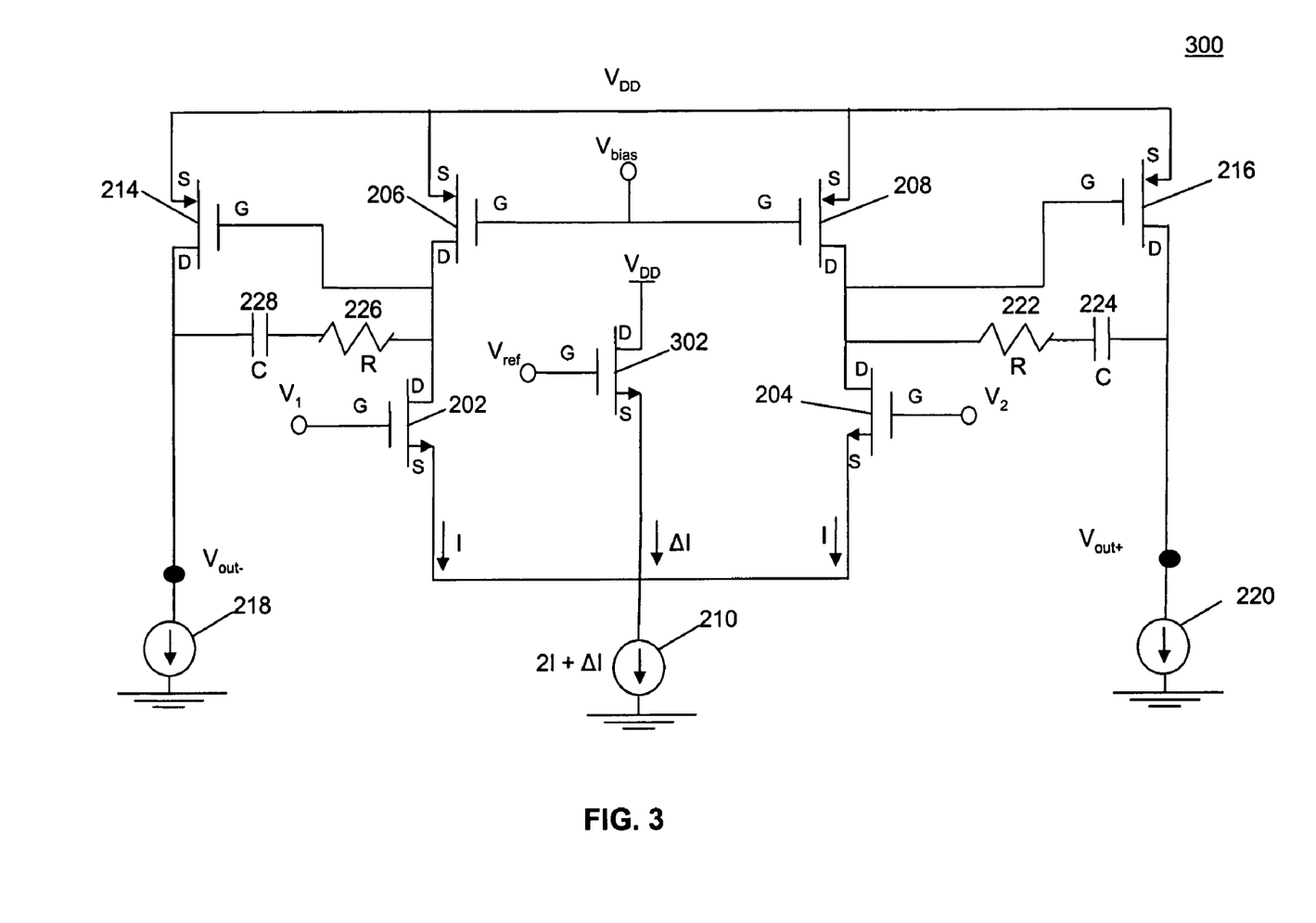

FIG. 3 shows a circuit diagram of an op-amp 300, according to an embodiment of the present invention. Op-amp 300 is similar to op-amp 200 described with reference to FIG. 2, except that current steering module 212 is implemented as a NMOS transistor 302. Transistor 302 receives reference voltage $V_{Ref}$ as its gate voltage. As the input common-mode voltage increases more current is steered from transistor 302 to transistors 202 and 204, i.e., I increases and $\Delta I$ decreases. An increase in current I decreases the gate voltages of transistors 214 and 216, increasing the output common-mode voltage of op-amp 300. As would be appreciated by those skilled in the relevant art(s) based on the description herein, as the input common-mode voltage decreases, current is steered to transistor 302 and the output common-mode voltage decreases in a similar manner.

Op-amp 300 does not include a DC feedback path between the input and output common-mode voltages. To have an output common-mode voltage that depends on the input common-mode voltage, then, an external DC path may be needed. For example, the input to op-amp 300 may be coupled to the output of op-amp 300 through one or more resistors (such an amplification circuit is described below with reference to FIG. 6).

The output common-mode voltage of op-amp 300 is set using the same loop as the differential-mode output voltage. Thus, similar to as described with reference to op-amp 200 shown in FIG. 2, the output common-mode voltage op-amp 300 uses resistors 222 and 226 and capacitors 224 and 228 for stability and is unconditionally stable. Op-amp 300 also can be implemented smaller than op-amp 100. Furthermore, op-amp 300, by essentially replacing single-stage op-amp 120 and capacitor 126 with transistor 302 also consumes less power than op-amp 100. For example, current $\Delta I$ that passes through transistor 302 can be on the order of one-tenth or less of current I that passes through transistors 202 and 204.

Figure 4:
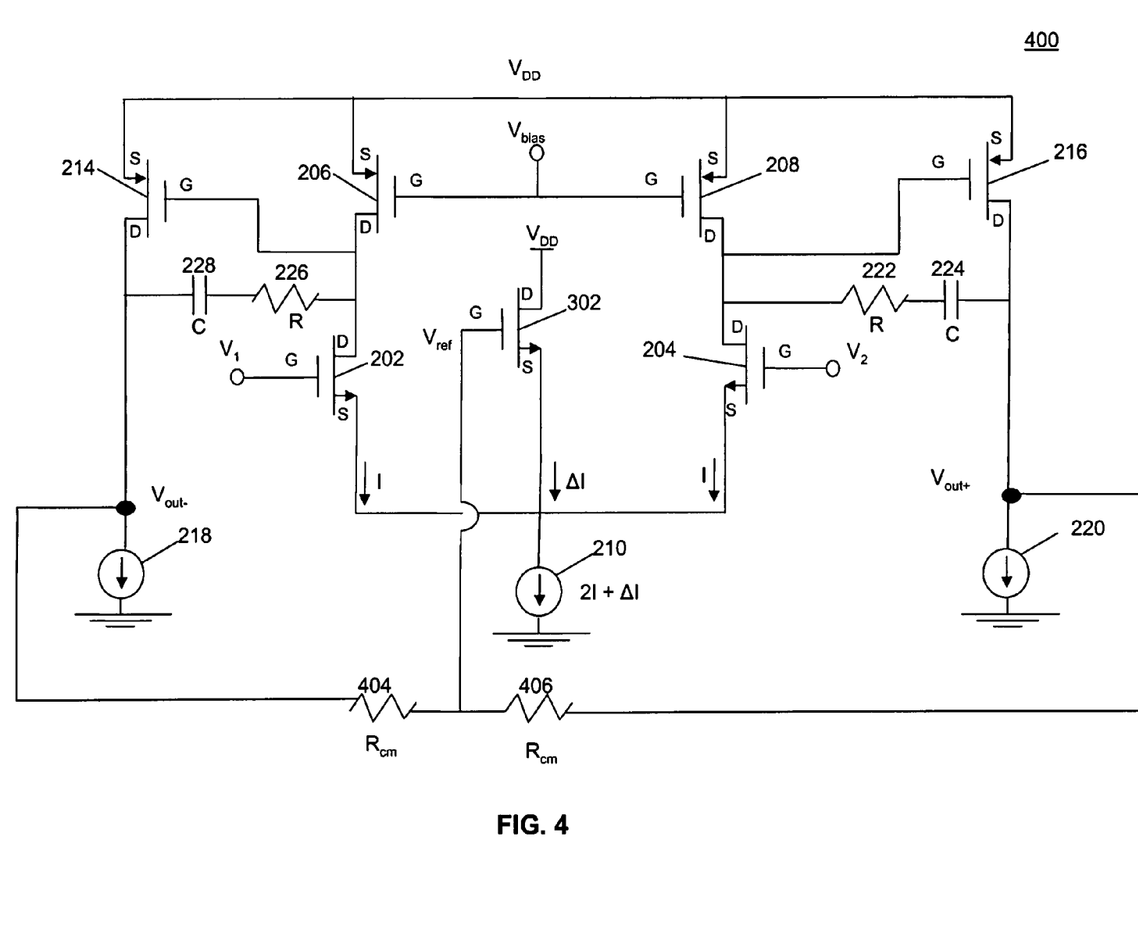

FIG. 4 shows an op-amp 400, according to an embodiment of the present invention. Op-amp 400 is substantially similar to op-amp 300 shown in FIG. 3, except that the gate of transistor 302 is coupled to the output of op-amp 400 through resistors 404 and 406. Thus, the output common-mode voltage essentially becomes the reference voltage, $V_{Ref}$, for transistor 302.

Resistors 404 and 406 are large resistors (e.g., on the order of 15 MΩ) used to sense the output common-mode voltage of op-amp 400. By coupling the gate of transistor 302 to the output common-mode voltage of op-amp 400, transistor 302 provides DC feedback path between the input and output of op-amp 400. In doing so, the output common-mode voltage of op-amp 400 can be set to a desired level without an externally provided DC path between the input and output. Specifically, the feedback path provided in op-amp 400 sets the output common-mode voltage equal to the input common-mode voltage.

At equilibrium, current I through each of transistors 202 and 204 and current $\Delta I$ through transistor 302 is such that the input and output common-mode voltages are equal. As the input common-mode voltage rises, current I temporarily increases. This increase results in an increase in the output common-mode voltage, and thus an increase in the gate voltage of transistor 302, and the current $\Delta I$. Current $\Delta I$ will continue to rise, and thus current I will continue to fall, until the system returns to the equilibrium state in which the input and output common-mode voltages are equal, i.e., until the values for I and $\Delta I$ return to the values for which the input and output common-mode voltages are the same.

Figure 5:
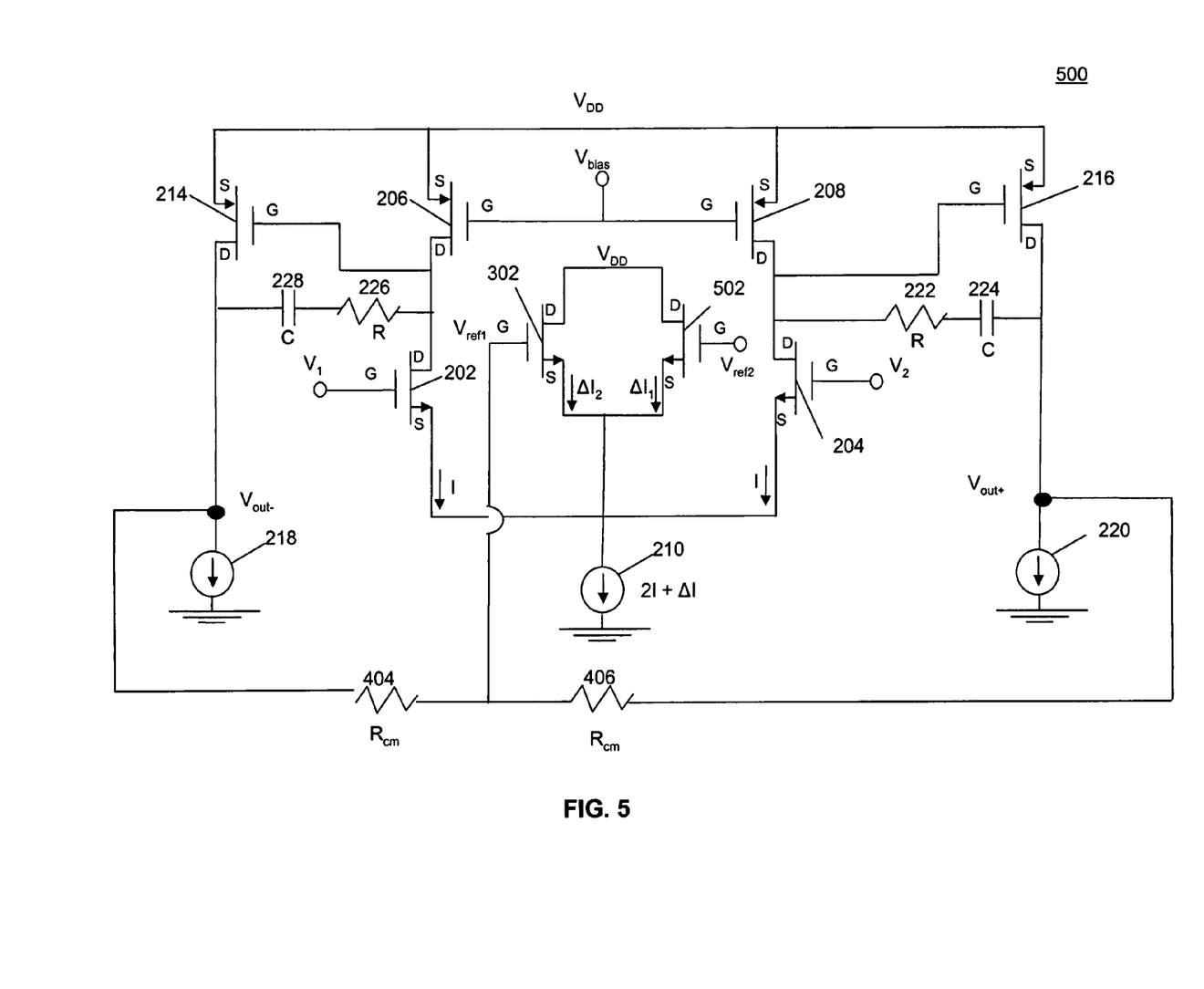

FIG. 5 shows an op-amp 500, according to an embodiment of the present invention. Op-amp 500 is generally similar to op-amp 400 shown in FIG. 4, except that op-amp 500 further includes an NMOS transistor 502. Transistors 302 and 502 are coupled together as a differential pair.

The gate of transistor 302 is coupled to the output common-mode voltage of op-amp 500 through resistors 404 and 406, similar to op-amp 400. Thus, similar to op-amp 400 shown in FIG. 4, the output common mode voltage at nodes $V_{out-}$ and $V_{out+}$ provides a voltage reference for the gate of transistor 302 (labeled as $V_{Ref1}$ in FIG. 5). The gate of transistor 502 receives a second reference voltage, $V_{Ref2}$, that is independently tunable, e.g., can be externally provided. Op-amp 500 allows the output common-mode voltage to be set to the second reference voltage $V_{Ref2}$.

As shown in FIG. 5, a current $\Delta I_1$ passes through transistor 302 and a current $\Delta I_2$ passes through transistor 502. At equilibrium, currents $\Delta I_1$ and $\Delta I_2$ are such that the output common-mode voltage is equal to $V_{Ref2}$, e.g., currents $\Delta I_1$ and $\Delta I_2$ are equal in the case that transistors 302 and 502 are identical. As the output common-mode voltage rises or falls relative to $V_{Ref2}$, feedback between the input and output common-modes results in the output common-mode being set back to $V_{Ref2}$. In particular, currents $\Delta I_1$ and $\Delta I_2$ adjust so that the output common-mode voltage is set to $V_{Ref2}$.

Thus, op-amp 500 allows for a DC feedback path between the input and output, and allows for the output common-mode voltage to be set based on an externally provided reference voltage. Although op-amp 500 includes an additional transistor compared to op-amps 300 and 400, it still enjoys advantages over op-amp 100 such as reduced power consumption and area. Furthermore, similar to op-amps 300 and 400, op-amp 500 also uses the same loop for both common and differential modes, thus op-amp 500 is also unconditionally stable and does not require additional stabilizing devices, i.e., the common-mode output voltage is stabilized using resistors 222 and 226 and capacitors 224 and 228.

Figure 6:
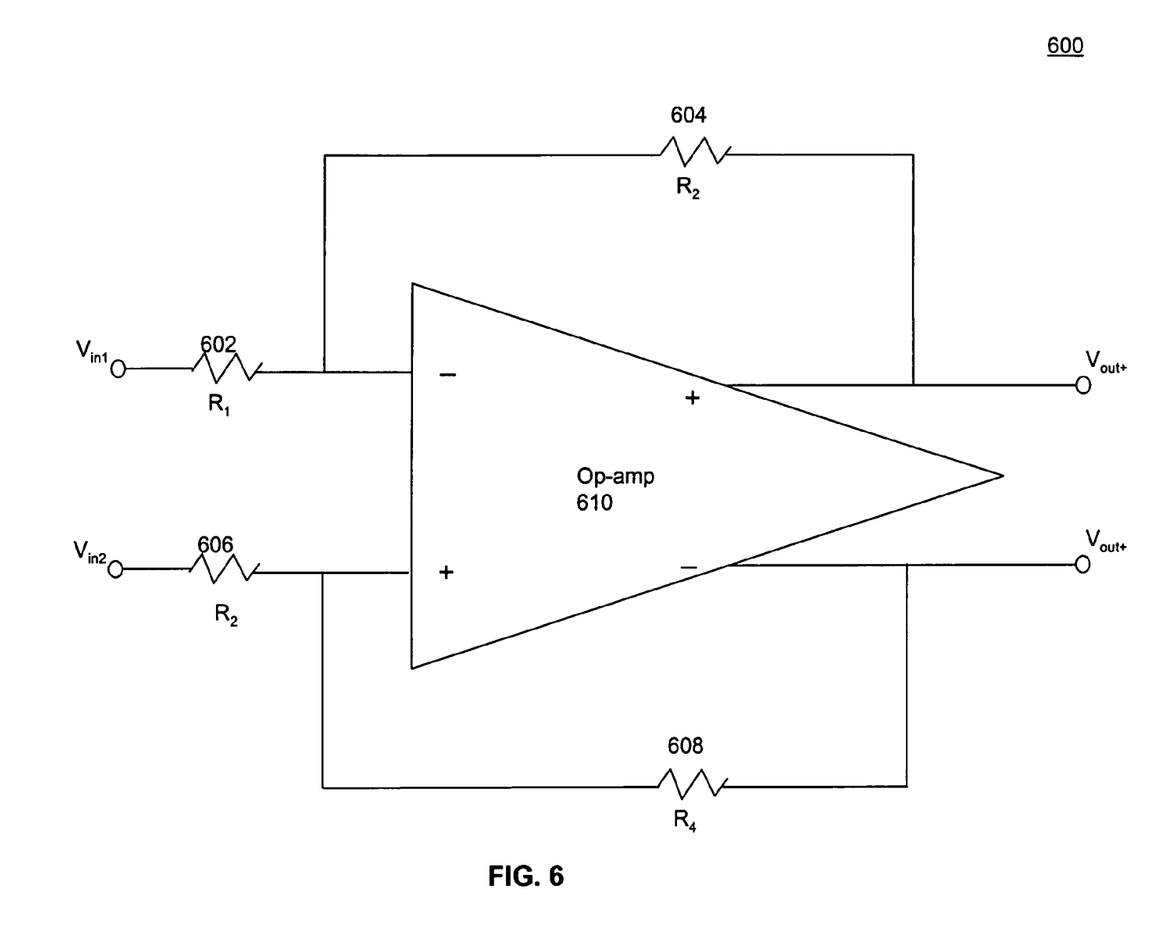
FIGS. 6 and 7 show circuit diagrams of amplifier circuits, according to embodiments of the present invention.

FIG. 6 shows an amplifier circuit 600, according to an embodiment of the present invention. Amplifier circuit 600 includes resistors 602-608 and op-amp 610. Resistors 602, 604, 606, and 608 have values R1, R2, R3, and R4, respectively. Amplifier circuit 600 outputs an amplified version of the difference between $V_{in1}$ and $V_{in2}$ as its differential-mode output.

Op-amp 610 can be implemented as op-amp 300 shown in FIG. 3. In particular, resistors 604 and 608 provide a DC feedback path between the inputs and outputs of op-amp 610. The output common-mode voltage of amplifier circuit 600 can be set to a desired level by choosing the values of R1, R2, R3, R4, and the value of the reference voltage provided to op-amp 610.

Even though operational amplifiers 400 and 500 include a DC feedback path between the input and output common-mode voltages, they also can be used for op-amp 610. In other words, the presence of an internal DC path between the input and output in op-amps 400 and 500 does not preclude them from being used as op-amp 610. In an embodiment, op-amp 600 can be used in signal receivers.

Figure 7:
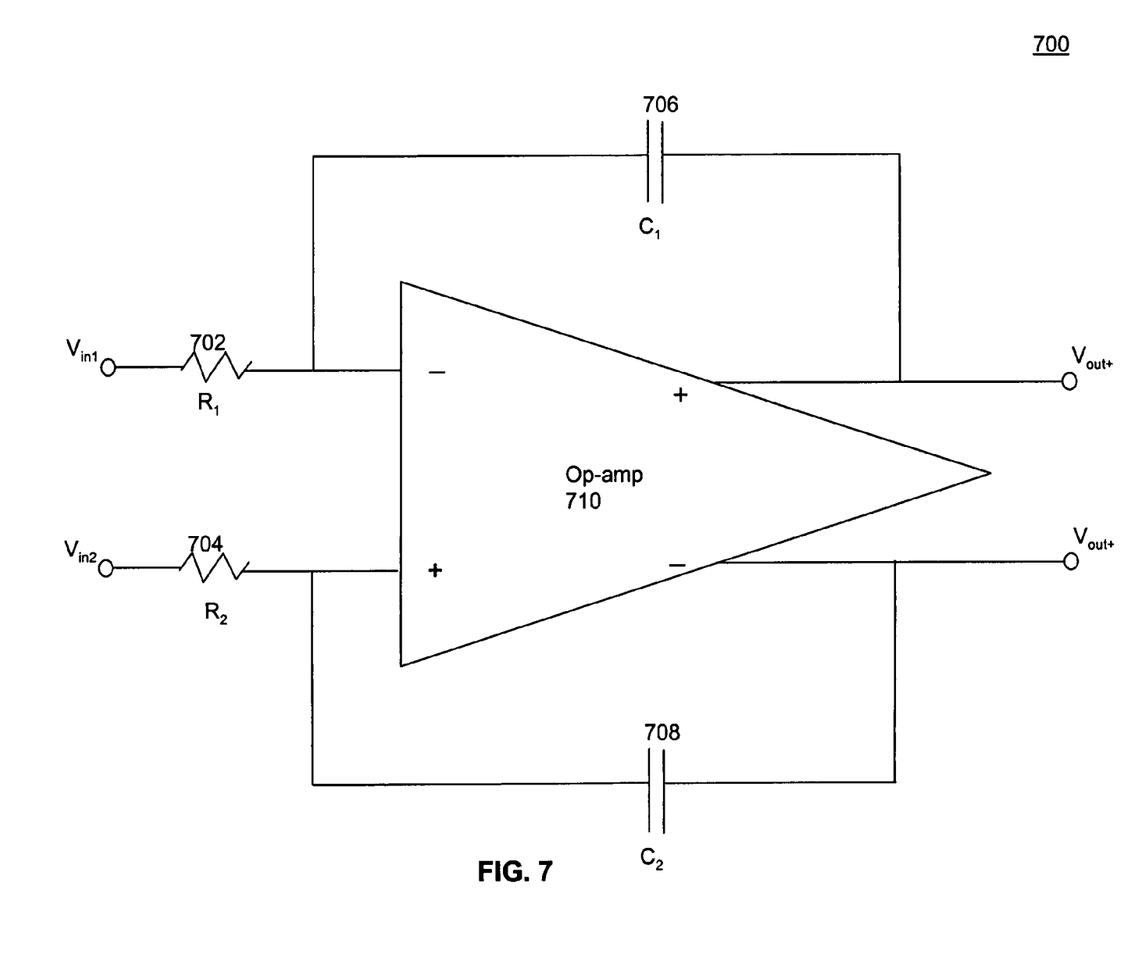

FIG. 7 shows an amplifier circuit 700, according to an embodiment of the present invention. Amplifier circuit 700 includes resistors 702 and 704, capacitors 706 and 708, and an op-amp 710. Amplifier circuit 700 operates as an integrator outputting an integral of the difference between input voltages $V_{in1}$ and $V_{in2}$.

In amplifier circuit 700, no DC path exists between the inputs and the outputs (capacitors 706 and 708 have infinite impedance at DC). Thus, op-amps 400 and 500 are well-suited to be used for op-amp 710. In particular, both op-amps 400 and 500 provide an internal DC feedback path between the inputs and the outputs, so that feedback can be used to set the output common-mode voltage. As described above, the common-mode output voltages of op-amps 400 and 500 are set based on the input common-mode voltage and reference voltage $V_{Ref}$, respectively. In an embodiment, op-amp 700 can be used in delta sigma or other applications that utilize integration functionality.

Figure 8:
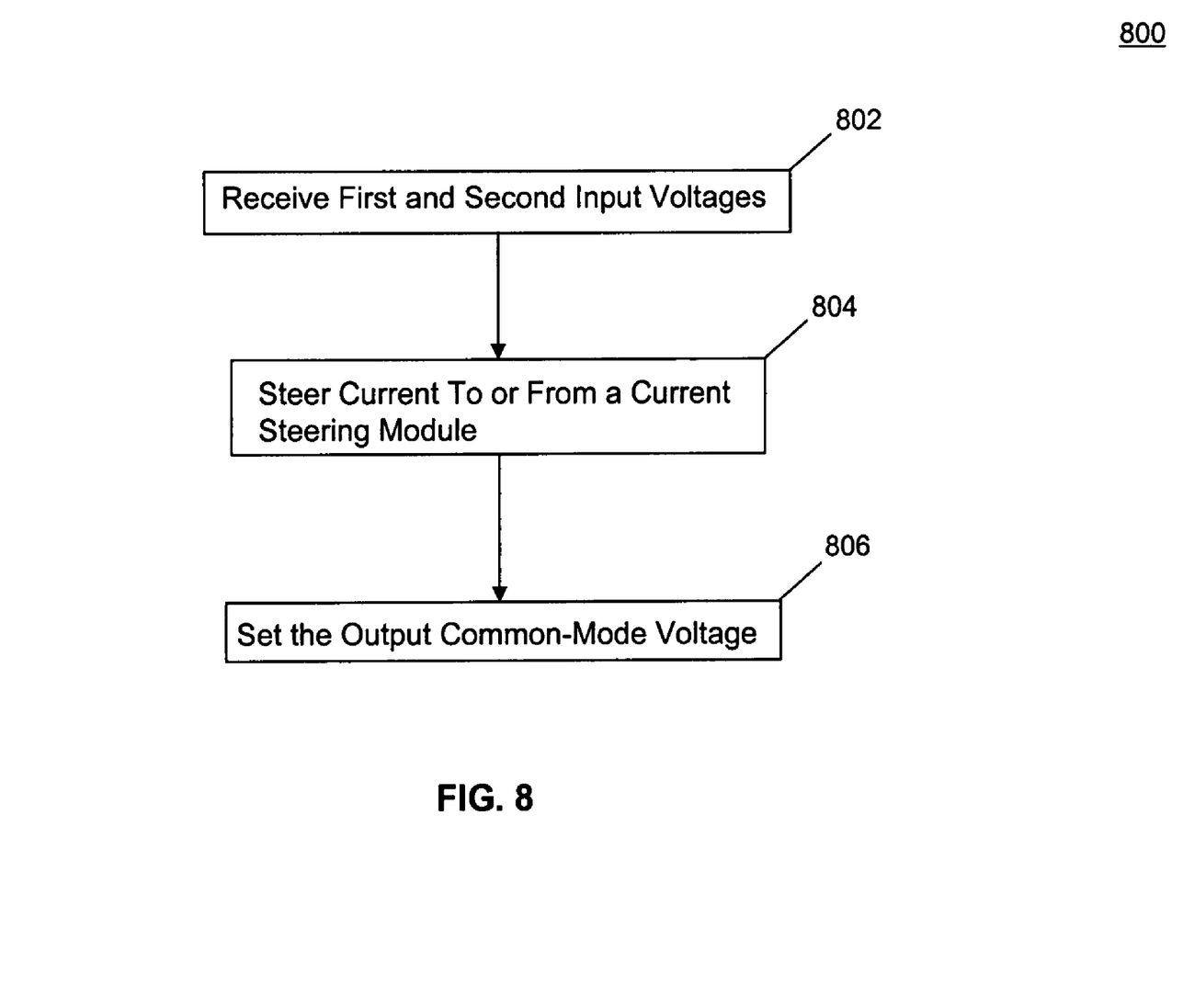
FIG. 8 shows a flowchart providing example steps for setting an output common-mode voltage, according to an embodiment of the present invention.

FIG. 8 shows a flowchart 800 providing example steps for producing an output common-mode voltage, according to an embodiment of the present invention. Other structural and operational embodiments will be apparent to persons skilled in the relevant art(s) based on the following discussion. The steps shown in FIG. 8 do not necessarily have to occur in the order shown. The steps of FIG. 8 are described in detail below.

In step 802, first and second input voltages are received. For example, in FIG. 2, transistors 202 and 204 receive first and second input voltages $V_1$ and $V_2$, respectively.

In step 804, current is steered from or to a current steering module based on the common-mode voltage of the first and second input voltages. In an embodiment, the first and second input voltages have the same common-mode voltage. For example, in FIG. 2, current is steered from or to current steering module 212 based on the values of the input common-mode voltage and reference voltage $V_{Ref}$. In the embodiment of FIGS. 3 and 4, current is steered from or to transistor 302 based on the difference between the input common-mode voltage and the reference voltage (in the embodiment of FIG. 4, the output common-mode voltage is the reference voltage). In the embodiment of FIG. 5, current is steered from or to transistors 302 and 502 based on the input and output common-mode voltage and reference voltage $V_{Ref}$.

In step 806, the output common-mode voltage is set. In an embodiment, the output common-mode voltage is set based on feedback between the input and output of the op-amp. For example, in FIGS. 4 and 5, the gate of transistor 302 senses the output common-mode voltage to create a DC feedback path between the input and output so that the output common-mode voltage can be set to a desired level. As described above, an external DC feedback path may be used when op-amp 300 shown in FIG. 3 is used, e.g., op-amp 300 may be used as op-amp 610 in amplification circuit 600 shown in FIG. 6.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An operational amplifier, comprising:
   a first transistor configured to receive a first input voltage;
   a second transistor configured to receive a second input voltage, wherein the first and second transistors form a differential pair;
   a current steering module coupled to first and second transistors and configured to sense an output common-mode voltage of the operational amplifier; and
   a current source configured to provide a current to the first and second transistors and the current steering module;
   wherein the first transistor, second transistor, and current steering module are configured such that a portion of the current is steered from the current steering module or to the current steering module based on common-mode voltages of the first and second input voltages and a common-mode output voltage of the operational amplifier to set the common-mode output voltage.

2. The operational amplifier of claim 1, wherein the first and second transistors are metal oxide field effect transistors.

3. The operational amplifier of claim 1, further comprising:
   a compensation capacitor coupled to the first transistor, wherein the compensation capacitor is configured to provide stability for differential and common mode outputs of the operational amplifier.

4. The operational amplifier of claim 1, wherein the current steering module comprises a third transistor configured to sense the output common-mode voltage.

5. The operational amplifier of claim 4, wherein the third transistor is a metal oxide field effect transistor.

6. The operational amplifier of claim 4, wherein the third transistor provides a feedback path such that the common-mode output voltage is set to a common-mode voltage of the first input voltage.

7. The operational amplifier of claim 4, wherein the current steering module further comprises:

a fourth transistor coupled to the third transistor, wherein the fourth transistor is configured to receive a reference voltage, wherein the current is steered from the current steering module or to the current steering module based on the common-mode voltages of the first and second input voltages, the output common-mode voltage, and the reference voltage, wherein the output common-mode voltage of the op-amp is set to the reference voltage.

8. The operational amplifier of claim 1, wherein operation amplifier comprises a first stage comprising the first and second transistors, and a load coupled to the first and second transistors, wherein the operational amplifier further comprises a second stage, including third and fourth transistors coupled to the first and second transistors, respectively.

9. The operational amplifier of claim 8, wherein the load comprises a fifth and sixth transistors coupled to the first and second transistors, respectively.

10. An amplifier circuit, comprising:
first and second resistors configured to receive first and second input voltages respectively; and
an operational amplifier, comprising:
  a first transistor coupled to the first resistor;
  a second transistor coupled to the second resistor, wherein the first and second transistors form a differential pair;
  a current steering module coupled to first and second transistors and configured to sense an output common-mode voltage of the operational amplifier; and
  a current source configured to provide a current and coupled to the first and second transistors and the current steering module;
  wherein the first transistor, second transistor, and current steering module are configured such that a portion of the current is steered from the current steering module or to the current steering module based on common-mode voltages of the first and second input voltages and a common-mode output voltage of the amplifier circuit voltage to set the common-mode output voltage.

11. The amplifier circuit of claim 10, further comprising:
a third resistor coupled to the first transistor and a first output of the amplifier circuit, wherein the third resistor provides a DC feedback path between the first input voltage and the first output.

12. The amplifier circuit of claim 10, further comprising:
a first capacitor coupled to the first transistor and a first output of the amplifier circuit.

13. A method of amplifying first and second input signals, comprising:
receiving a first voltage signal at a first transistor of an operational amplifier;
receiving a second voltage signal at a second transistor of an operational amplifier, wherein the first and second transistors form a differential pair and wherein the first and second transistors are coupled to a current steering module;
steering a portion of a current provided by a current source from the current steering module or to the current steering module based on an output common-mode voltage of the operational amplifier reference voltage and common-mode voltages of the first and second voltage signals to set the output common-mode voltage of.

14. The method of claim 13, wherein steering comprises:
steering current such that the common-mode output voltage is set to a common-mode voltage of the first voltage signal.

15. The method of claim 13, wherein steering comprises:
steering current from the first and second transistors based on a reference voltage such that the output common-mode voltage of the operational amplifier is set to the reference voltage.

* * * * *